US009036312B2

(12) United States Patent  
Kato et al.

(10) Patent No.: US 9,036,312 B2  
(45) Date of Patent: May 19, 2015

(54) SEMICONDUCTOR DEVICE

(71) Applicant: Kabushiki Kaisha Toshiba, Tokyo (JP)

(72) Inventors: Kazuhiro Kato, Kanagawa (JP);
Hiroyuki Tsurumi, Kanagawa (JP);
Yukio Sato, Kanagawa (JP); Takehito Ikimura, Kanagawa (JP); Akira Kumamoto, Tokyo (JP); Hiroyuki Yamamoto, Kanagawa (JP); Shoichi Imakake, Kanagawa (JP); Tooru Asakawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 91 days.

(21) Appl. No.: 13/783,079

(22) Filed: Mar. 1, 2013

(65) Prior Publication Data

US 2013/0242449 A1    Sep. 19, 2013

(30) Foreign Application Priority Data

Mar. 16, 2012  (JP) .................... 2012-059591

(51) Int. Cl.
*H02H 3/22* (2006.01)
*H02H 3/08* (2006.01)
*H01L 27/02* (2006.01)
*H02H 9/04* (2006.01)

(52) U.S. Cl.
CPC ............. *H02H 3/08* (2013.01); *H01L 27/0255* (2013.01); *H02H 9/041* (2013.01)

(58) Field of Classification Search
USPC .............................. 361/6, 56, 111
See application file for complete search history.

(56) References Cited

U.S. PATENT DOCUMENTS

| 5,301,084 | A | 4/1994 | Miller |
| 5,986,861 | A | 11/1999 | Pontarollo |
| 6,249,410 | B1 | 6/2001 | Ker et al. |
| 7,224,560 | B2 * | 5/2007 | May et al. ............ 361/56 |

(Continued)

FOREIGN PATENT DOCUMENTS

| JP | 08051184 A | 2/1996 |
| JP | 3174636 | 6/2001 |

(Continued)

OTHER PUBLICATIONS

Japanese Office Action dated Apr. 22, 2014, filed in Japanese counterpart Application No. 2012-059591, 3 pages (with translation).
Japanese Office Action dated Aug. 12, 2014, filed in Japanese counterpart Application No. 2012-059591, 6 pages (with translation).

*Primary Examiner* — Danny Nguyen  
(74) *Attorney, Agent, or Firm* — Patterson & Sheridan, LLP

(57) ABSTRACT

A semiconductor device for protecting loads from power surges includes a first resistor having a first end connected to a first supply terminal, a capacitor connected to a second end of the first resistor and a second supply terminal. There is a first transistor with a source connected to the first supply terminal and a gate connected to a point between the first resistor and the capacitor. A second resistor is connected between the drain of the first transistor and the second supply terminal, and a first diode is connected between the gate and the source of the first transistor. A second transistor has a drain connected to the first supply terminal, a source connected to the second supply terminal, and a gate connected to the drain of the first transistor. There is a second diode connected between the gate and the source of the second transistor.

16 Claims, 2 Drawing Sheets

(56) References Cited

U.S. PATENT DOCUMENTS

| | | |
|---|---|---|
| 2003/0026054 A1 | 2/2003 | Hulfachor et al. |
| 2007/0247772 A1 | 10/2007 | Keppens et al. |
| 2009/0086393 A1 | 4/2009 | Watanabe |
| 2011/0304940 A1* | 12/2011 | Cao et al. ......................... 361/56 |
| 2012/0127618 A1* | 5/2012 | Hong .............................. 361/56 |
| 2012/0162833 A1* | 6/2012 | Russ et al. ...................... 361/56 |

FOREIGN PATENT DOCUMENTS

| | | |
|---|---|---|
| JP | 2008227003 A | 9/2008 |
| JP | 2009-021332 | 1/2009 |
| JP | 2010-050312 | 3/2010 |

* cited by examiner

SEMICONDUCTOR DEVICE

CROSS-REFERENCE TO RELATED APPLICATION

This application is based upon and claims the benefit of priority from Japanese Patent Application No. 2012-059591, filed Mar. 16, 2012; the entire contents of which are incorporated herein by reference.

FIELD

Embodiments described herein relate generally to a semiconductor device.

BACKGROUND

Traditionally, in order to protect a circuit from a surge, a protection circuit is included between the supply terminal and the ground terminal. This protection circuit operates only in the case a surge is applied to the supply terminal or the ground terminal. In general, a diode connected in the reverse direction between the supply terminal and the ground terminal is used in the protection circuit.

In the protection circuit, the diode permits an electric current to flow from the supply terminal to the ground terminal by breaking down when a surge current is applied thereto. However, when the breakdown voltage is high, the voltage at which the protection circuit begins to operate increases, and so the breakdown voltage of the protected circuit needs to be increased, which typically causes an increase in the size of the entire circuit.

DETAILED DESCRIPTION

The disclosure describes a semiconductor device with a reduced circuit area. In general, a semiconductor device according to an embodiment possesses: a first resistor, a capacitor, a first transistor, a second resistor, a first diode, a second transistor, and a second diode. The first resistor is connected at one end to a first supply terminal, at which may have a first power-source voltage is applied. The capacitor is connected in between the other end of the first resistor and a second supply terminal, at which a second power-source voltage may be applied. The first transistor has a source connected to the first supply terminal, and a gate connected to a connection point between the first resistor and the capacitor. The second resistor is connected in between a drain of the first transistor and the second supply terminal. The first diode is connected in between the gate and the source of the first transistor. The second transistor has a drain connected to the first supply terminal and a source connected to the second supply terminal, and a gate that is driven by an output from the drain of first transistor. The second diode is connected in between the gate and the source of the second transistor.

First Embodiment

Figure 1:
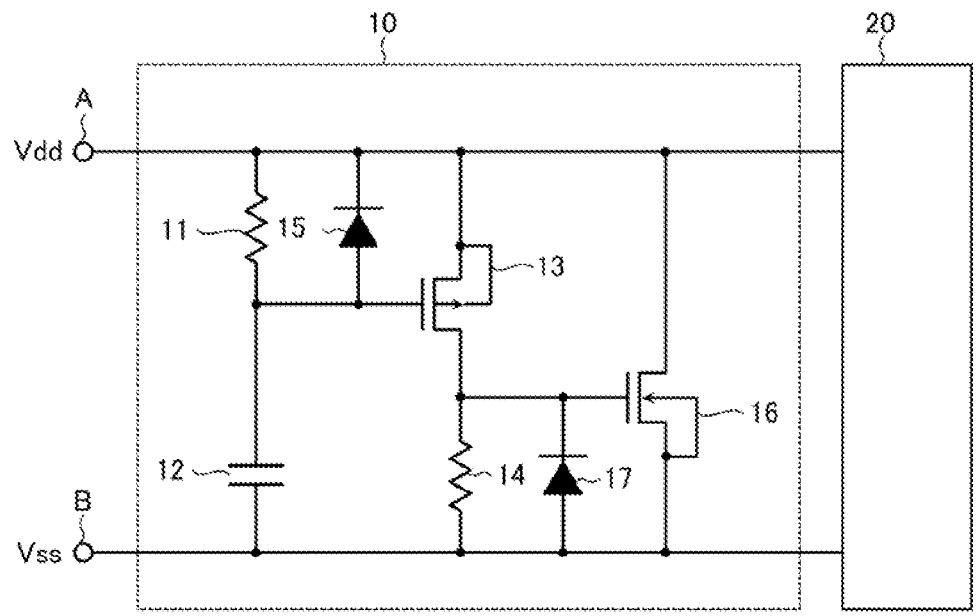
FIG. 1 is a circuit diagram that depicts a semiconductor device according to a first embodiment.

First, a composition of a semiconductor device according to the first embodiment will be described with reference to FIG. 1. FIG. 1 is a circuit diagram of the semiconductor device according to the first embodiment. As shown in FIG. 1, the semiconductor device includes a protection circuit 10 that is connected between a supply terminal A and an ground terminal B, and an internal circuit 20. The protection circuit 10, that when a surge is applied to a supply terminal A or a ground terminal B, functions as a surge protection circuit that provides protection so that the surge is not applied to the internal circuit 20. Under normal operation, the supply terminal A is applied with a power source voltage Vdd as the first supply terminal, and the ground terminal B is applied with a ground voltage Vss as the second supply terminal.

The protection circuit 10, as shown in FIG. 1, is equipped with: a resistor (first resistor) 11 and a capacitor 12 that are connected in series between the supply terminal A and the ground terminal B, a PMOS transistor (first transistor) 13, which amplifies a potential between the mutually connected ends of the resistor 11 and the capacitor 12, and an NMOS transistor (second transistor) 16, which applies an over-current at the time of surge application, and which is driven by the PMOS transistor 13.

The PMOS transistor has a source connected to the supply terminal A and a gate connected to a connection point between the connected ends of the resistor 11 and the capacitor 12. A resistor (second resistor) 14 is connected between the drain of the PMOS transistor 13 and the ground terminal B. Also, between the gate and the source of the PMOS transistor 13 is connected a diode (first diode) 15 connected such that the gate side of the PMOS transistor 13 will be an anode and the source side will be a cathode for the diode 15.

The NMOS transistor 16 has a drain connected to the supply terminal A and a source connected to the ground terminal B; a gate of NMOS transistor 16 is connected to a connection point between mutually connected portions of the PMOS transistor 13 and the resistor 14. Also, between the gate and the source of the NMOS transistor 16 is connected a diode (second diode) 17 connected such that the source side of the NMOS transistor 16 will be the anode and the gate side will be the cathode for the diode 17.

For the NMOS transistor 16, because it is in an ON state when applying an over-current in response to the surge in the final stage, it is preferable to use a transistor that is high-voltage. The PMOS transistor 13 possesses the capability to drive the NMOS transistor 16. For these MOS transistors 13 and 16, those with a LDMOS (Laterally Diffused MOS) structure can be used as well.

For the resistors 11 and 14, polysilicon resistors, bulk resistors, interconnection resistors, and diffused resistors, etc., can be used. For the capacitor 12, for example, MIM (Metal-Insulator-Metal) structure, MOS structure, etc., can be used. The diodes 15 and 17 are to clamp between the gate and the source at a fixed voltage so that the voltage between the gate and the source of the PMOS transistor 13 and the NMOS transistor 16 does not become too large and damage/destroy the gate oxide film (gate insulator film) of these transistors 13 and 16. Therefore, a Zener diode is preferable, but other options include transistors where the back-gate and the source have been short-circuited, or one in which the base emitter of a bipolar transistor has been short-circuited.

Next, the behavior of the protection circuit 10 when a positive surge is applied to the supply terminal A is described with reference to FIG. 1. When a positive surge is applied to the supply terminal A, first, charging of the capacitor 12 via the resistor 11 is started. With this, a potential drop is generated across the resistor 11, and a set potential difference is generated between the gate/source of the PMOS transistor 13, so the PMOS transistor 13 enters a conducting state. As a result, an electric current is applied to the resistor 14 via the PMOS transistor 13, and a set potential difference is generated between the gate-source of the NMOS transistor 16, so the NMOS transistor 16 enters a conducting state. Thus, the NMOS transistor 16 can apply a surge current from the supply terminal A to the ground terminal B, and therefore, the protection circuit 10 protects the internal circuit 20 from the positive surge. Meanwhile, under the normal state, since a power-source voltage Vdd is charged to the capacitor 12, the PMOS transistor 13 and the NMOS transistor 16 are in a non-conducting state, and the power-source voltage Vdd is supplied to the internal circuit 20 by capacitor 12.

According to this embodiment, because the NMOS transistor 16 that applies the surge current to the ground terminal is driven by the PMOS transistor 13 and enters a conducting state, in contrast to entering a conducting state by the breakdown voltage, the protective function operates at a lower voltage. For this reason, the breakdown voltage of the internal circuit 20 can be set lower, and the overall circuit area of the internal circuit 20 can be reduced. Also, the protection circuit 10, because it operates under a state in which the transistors 13 and 16 have not reached the breakdown voltage, can have its circuit area reduced. Furthermore, since a diode is connected in the reverse direction between the gate/source of the PMOS transistor 13 and the NMOS transistor 16, it can prevent the full-swing drive between the source/gate, and therefore prevent the destruction of the gate oxide film of the MOS transistors 13 and 16.

Second Embodiment

Figure 2:
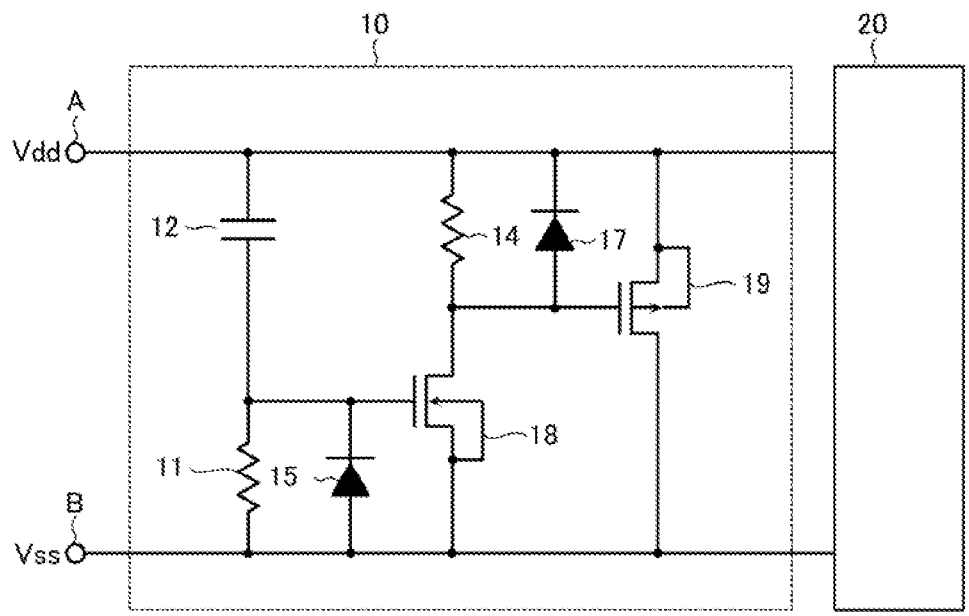
FIG. 2 is a circuit diagram that depicts a semiconductor device according to a second embodiment.

Next, the semiconductor device according to the second embodiment is described with reference to FIG. 2. FIG. 2 is a circuit diagram of the semiconductor device that according to the second embodiment. In the first embodiment, the supply terminal A is made the first supply terminal and the ground terminal B is made the second supply terminal, but in the second embodiment, the supply terminal A is made the second supply terminal, and the ground terminal B is made the first supply terminal. That is, in the semiconductor device that according to the second embodiment, the protection circuit 10 includes the NMOS transistor 18 instead of the PMOS transistor 13 as the first transistor that drives the second transistor in the final stage, and the PMOS transistor 19 instead of the NMOS transistor 16 as the second transistor that applies the surge current.

In the series circuit of the resistor 11 and the capacitor 12, the supply terminal A side is the capacitor 12 and the ground terminal B side is the resistor 11. The resistor 14 is connected between the supply terminal A and the drain of the NMOS transistor 18 and regarding the diode 15, the anode side is connected to the ground terminal B, and the cathode side is connected to the gate of the NMOS transistor 18. Regarding the diode 17, the anode side is connected to the gate of the PMOS transistor 19 and the cathode side is connected to the supply terminal A.

Next, the behavior of the semiconductor device in the case that a positive surge is applied to the supply terminal A is described with reference to FIG. 2. When a positive surge is applied to the supply terminal A, first, charging of the charge on the capacitor 12 is begun. As a result, a set potential difference is generated between the gate/source of the NMOS transistor 18, so the NMOS transistor 18 enters a conducting state. Next, with a current applied on the NMOS transistor 18, a set potential difference is generated between the gate/source of the PMOS transistor 19, and the PMOS transistor 19 enters a conducting state. Thus, the PMOS transistor 19 can apply a surge current from the supply terminal A to the ground terminal B, and in this way, the protection circuit 10 protects the internal circuit 20 from the positive surge.

Third Embodiment

Figure 3:
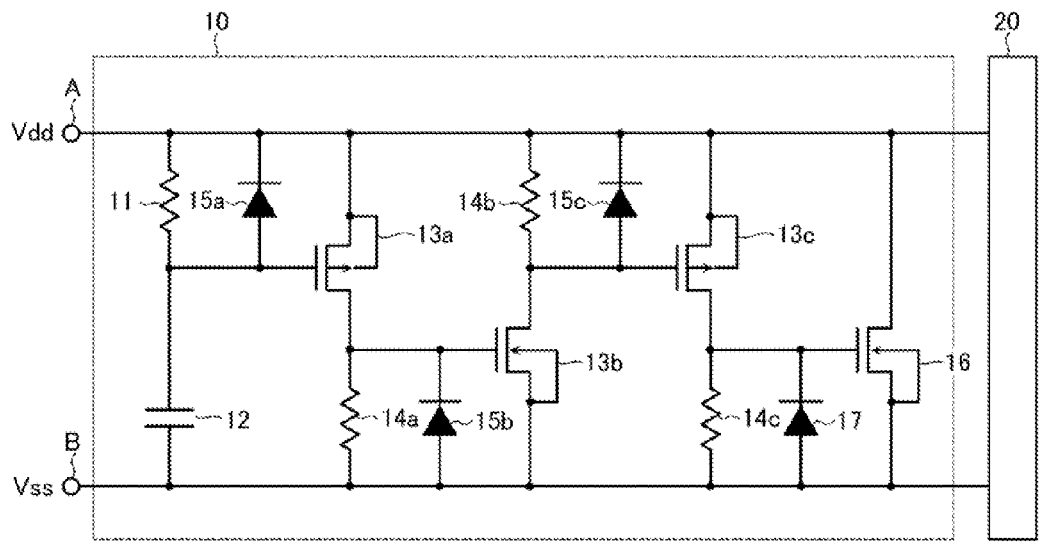
FIG. 3 is a circuit diagram that depicts a semiconductor device according to a third embodiment.

Next, the semiconductor device according to the third embodiment is described with reference to FIG. 3. FIG. 3 is a circuit diagram of the semiconductor device that according to the third embodiment. In the semiconductor device according to the third embodiment, as shown in FIG. 3, by making the transistor that drives the NMOS transistor (second transistor) 16 of the first embodiment a three-stage transistor composed of a PMOS transistor (first transistor) 13a, an NMOS transistor (third transistor) 13b, and a PMOS transistor (fourth transistor) 13c, one can further improve the drive capacity. The PMOS transistor 13a, NMOS transistor 13b, and PMOS transistor 13c are each connected on their drain side to a resistor (second resistor) 14a, resistor (third resistor) 14b, and resistor (fourth resistor) 14c, respectively. On the gate/source side of transistors 13a-13c are each connected by a diode, diode (first diode) 15a, diode (third diode) 15b, and diode (fourth diode) 15c, respectively, with each diode in the reverse direction.

By composing it in this way, each MOS transistor 13a, 13b, 13c, even though they are half-swing drives, can drive the NMOS transistor 16 of the final stage with sufficient drive force, and can apply more surge currents. All other descriptions, since they are the same as the first embodiment, are omitted.

Fourth Embodiment

Figure 4:
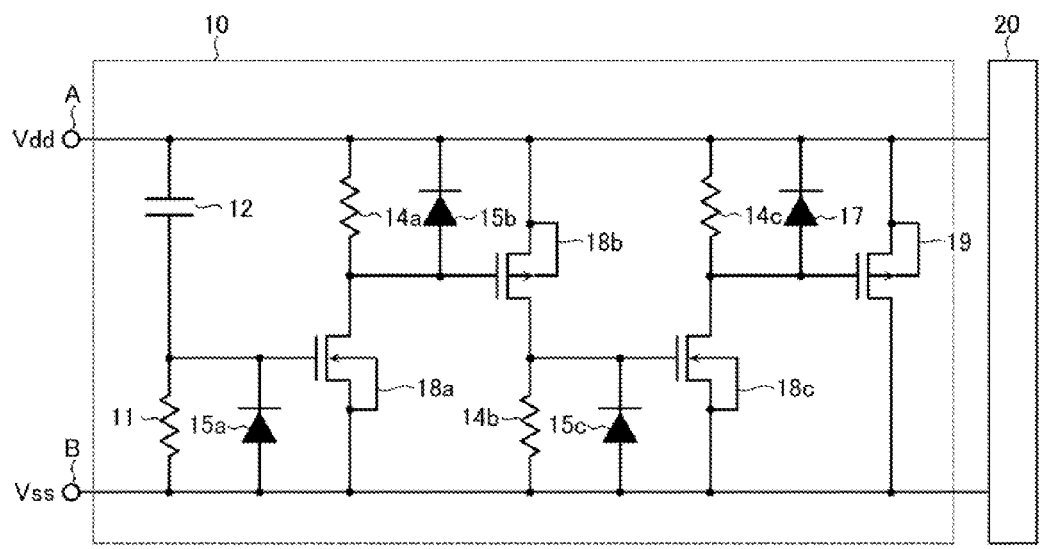
FIG. 4 is a circuit diagram that depicts a semiconductor device according to a fourth embodiment.

Next, a semiconductor device according to the fourth embodiment is described with reference to FIG. 4. FIG. 4 is a circuit diagram of the semiconductor device according to the fourth embodiment. In the semiconductor device shown in FIG. 4, by making the transistor that drives the PMOS transistor (second transistor) 19 of the second embodiment a three-stage transistor composed of an NMOS transistor (first transistor) 18a, a PMOS transistor (third transistor) 18b, and an NMOS transistor (fourth transistor) 18c, one can further improve the drive capacity. NMOS transistor 18a, PMOS transistor 18b, and NMOS transistor 18c are each connected in their drain side to a resistor (second resistor) 14a, resistor (third resistor) 14b, and resistor (fourth resistor) 14c, respectively. On the gate/source side the transistors 14a-14c are each connected by diode, diode (first diode) 15a, diode (third diode) 15b, and diode (fourth diode) 15c, respectively. Each diode is connected in the reverse direction, as in the third embodiment.

In this embodiment, the three stage transistor can drive the PMOS transistor 19 of the final stage with sufficient drive force, and can apply more surge currents.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
    a first resistor having a first end connected to a first supply terminal;
    a capacitor that is connected to a second end of the first resistor and a second supply terminal;
    a first transistor having a source connected to the first supply terminal and a gate connected to a point between the first resistor and the capacitor;
    a second resistor that is connected between a drain of the first transistor and the second supply terminal;
    a first diode that is connected between the gate and the source of the first transistor;
    a second transistor having a drain connected to the first supply terminal, a source connected to the second supply terminal;
    a second diode connected between the gate and the source of the second transistor;
    a third transistor having a source connected to the second supply terminal and a gate connected to a point between the drain of the first transistor and the second resistor;
    a third resistor that is connected between a drain of the third transistor and the first supply terminal;
    a third diode that is connected between the gate and the source of the third transistor;
    a fourth transistor having a source connected to the first supply terminal and a gate connected to a point between a drain of the third transistor and the third resistor;
    a fourth resistor that is connected between the drain of the fourth transistor and the second supply terminal; and
    a fourth diode that is connected between the gate and the source of the fourth transistor,
    wherein a gate of the second transistor is connected to a point between the drain of the fourth transistor and the fourth resistor.

2. The semiconductor device according to claim 1, wherein the first diode is connected between the gate and the source of the first transistor in a reverse direction with regard to a voltage across the first resistor, and
    the second diode is connected between the gate and the source of the second transistor in a reverse direction with regard to a voltage across the second resistor.

3. The semiconductor device according to claim 1, wherein
    a first power-source voltage is applied at the first supply terminal;
    a second power-source voltage is applied at the second supply terminal, and the first power-source voltage is higher than the second power-source voltage;
    the first transistor and the fourth transistor are composed of p-type transistors; and
    the second transistor and the third transistor are composed of n-type transistors.

4. The semiconductor device according to claim 1, wherein
    a first power-source voltage is applied at the first supply terminal;
    a second power-source voltage is applied at the second supply terminal, and the first power-source voltage is lower than the second power-source voltage;
    the first transistor and fourth transistor are composed of n-type transistors; and
    the second transistor and third transistor are composed of p-type transistors.

5. The semiconductor device according to claim 1, wherein the first and fourth transistors are p-type transistors.

6. The semiconductor device according to claim 1, wherein the second and third transistors are n-type transistors.

7. The semiconductor device according to claim 1, wherein the first and second diodes are Zener diodes.

8. A semiconductor device, comprising:
    a first resistor having a first end connected to a first supply terminal to which a first power-source voltage is applied;
    a capacitor that is connected to a second end of the first resistor and a second supply terminal to which a second power-source voltage is applied;
    a first transistor having a source connected to the first supply terminal and a gate connected to a point between the first resistor and the capacitor;
    a second resistor that is connected between a drain of the first transistor and the second supply terminal;
    a first diode that is connected between the gate and the source of the first transistor, the first diode connected in a reverse direction with regard to a voltage across the first resistor;
    a second transistor having a drain connected to the first supply terminal, a source connected to the second supply terminal;
    a second diode that is connected between the gate and the source of the second transistor, the second diode connected in a reverse direction with regard to a voltage across the first resistor;
    a third transistor having a source connected to the second supply terminal and a gate connected to a point between the drain of the first transistor and the second resistor;
    a third resistor that is connected between a drain of the third transistor and the first supply terminal;
    a third diode that is connected between the gate and the source of the third transistor;
    a fourth transistor having a source connected to the first supply terminal and a gate connected to a point between a drain of the third transistor and the third resistor;
    a fourth resistor that is connected between the drain of the fourth transistor and the second supply terminal;
    a fourth diode that is connected between the gate and the source of the fourth transistor,
    wherein a gate of the second transistor is connected to a point between the drain of the fourth transistor and the fourth resistor.

9. The semiconductor device according to claim 8, wherein the first transistor comprises a p-type metal-oxide-semiconductor transistor, the second transistor comprises a n-type metal-oxide-semiconductor transistor, the third transistor comprises a n-type metal-oxide-semiconductor transistor, and the fourth transistor comprises a p-type metal-oxide-semiconductor transistor.

10. The semiconductor device according to claim 8, wherein the first transistor comprises a plurality of transistors.

11. The semiconductor device according to claim 8,
    the first transistor comprises a n-type metal-oxide-semiconductor transistor, the second transistor comprises a p-type metal-oxide-semiconductor transistor, the third transistor comprises a p-type metal-oxide-semiconductor transistor, and the fourth transistor comprises a n-type metal-oxide-semiconductor transistor.

12. A method of protecting a load against a surge current with a circuit having:
    a first resistor having a first end connected to a first supply terminal;
    a capacitor that is connected to a second end of the first resistor and a second supply terminal;

a first transistor having a source connected to the first supply terminal and a gate connected to a point between the first resistor and the capacitor;

a second resistor that is connected between a drain of the first transistor and the second supply terminal;

a first diode that is connected between the gate and the source of the first transistor;

a second transistor having a drain connected to the first supply terminal, a source connected to the second supply terminal;

a second diode that is connected between the gate and the source of the second transistor;

a third transistor having a source connected to the second supply terminal and a gate connected to a point between the drain of the first transistor and the second resistor;

a third resistor that is connected between a drain of the third transistor and the first supply terminal;

a third diode that is connected between the gate and the source of the third transistor;

a fourth transistor having a source connected to the first supply terminal and a gate connected to a point between a drain of the third transistor and the third resistor;

a fourth resistor that is connected between the drain of the fourth transistor and the second supply terminal; and a fourth diode that is connected between the gate and the source of the fourth transistor;

the method comprising:

receiving a surge current at the first supply terminal;

turning on the first transistor to allow the surge current to pass through the first transistor and the second resistor to the second supply terminal;

turning on the third transistor to allow the surge current to pass through the third transistor and the third resistor to the second terminal by the turning on of the first transistor;

turning on the fourth transistor to allow the surge current to pass through the fourth transistor and fourth resistor by turning on of the third transistor; and turning on the second transistor to allow the surge current to pass through the second transistor to the second supply terminal by the turning on of the fourth transistor.

13. The method of claim 12, wherein the surge current is received at the first supply terminal and the first transistor is a p-type transistor and the second transistor is an n-type transistor.

14. The method of claim 12, wherein the surge current is received at the second supply terminal and the first transistor is an n-type transistor and the second transistor is an p-type transistor.

15. The method of claim of 12, wherein the surge current is received at the first supply terminal and the first transistor is a p-type transistor, the second transistor is an n-type transistor, the third transistor is an n-type transistor, and the fourth transistor is a p-type transistor.

16. The method of claim of 12, wherein the surge current is received at the second supply terminal and the first transistor is a n-type transistor, the second transistor is an p-type transistor, the third transistor is an p-type transistor, and the fourth transistor is a n-type transistor.

* * * * *